(12) United States Patent
Liu et al.

(10) Patent No.: US 9,484,455 B2
(45) Date of Patent: Nov. 1, 2016

(54) ISOLATION NLDMOS DEVICE AND A MANUFACTURING METHOD THEREFOR

(71) Applicant: SHANGHAI HUAHONG GRACE SEMICONDUCTOR MANUFACTURING CORPORATION, Shanghai (CN)

(72) Inventors: Donghua Liu, Shanghai (CN); Wenting Duan, Shanghai (CN); Wensheng Qian, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/978,194

(22) Filed: Dec. 22, 2015

(65) Prior Publication Data

US 2016/0233332 A1 Aug. 11, 2016

(30) Foreign Application Priority Data

Feb. 10, 2015 (CN) .......................... 2015 1 0067904

(51) Int. Cl.
*H01L 29/66* (2006.01)
*H01L 29/78* (2006.01)
*H01L 29/10* (2006.01)

(52) U.S. Cl.
CPC ....... *H01L 29/7823* (2013.01); *H01L 29/1095* (2013.01); *H01L 29/66681* (2013.01)

(58) Field of Classification Search
CPC ........... H01L 29/7823; H01L 29/7816; H01L 29/66681; H01L 29/1095; H01L 29/402; H01L 29/42368; H01L 29/7835; H01L 29/66477

See application file for complete search history.

(56) References Cited

U.S. PATENT DOCUMENTS

| 9,257,534 B2* | 2/2016 | Chan ................. H01L 29/66681 |
| 9,349,830 B2* | 5/2016 | Chan ................. H01L 29/66477 |
| 2012/0228704 A1* | 9/2012 | Ju .......................... H01L 29/402 257/339 |
| 2015/0325639 A1* | 11/2015 | Liao .................. H01L 29/41758 327/434 |

* cited by examiner

*Primary Examiner* — Thanh Y Tran
(74) *Attorney, Agent, or Firm* — MKG, LLC

(57) ABSTRACT

An isolation NLDMOS device including: an N well and a P well adjacent to each other on an upper part of a P substrate; on the upper part of the P well are sequentially arranged a first P type heavily doped region, a first field oxide, and a second P type heavily doped region; on the upper part of the N well are arranged a second field oxide and an N type heavily doped region; a gate oxide is between the second P type heavily doped region and the second field oxide; a gate polysilicon sits above the gate oxide and part of the second field oxide; from the first P type heavily doped region, the second P type heavily doped region and the N type heavily doped region are led out each a connecting wire via a respective contact hole.

12 Claims, 4 Drawing Sheets

ISOLATION NLDMOS DEVICE AND A MANUFACTURING METHOD THEREFOR

FIELD OF INVENTION

The present invention relates to semiconductor manufacturing and in particular relates to a 40V isolation NLDMOS (N-type Laterally Diffused Metal Oxide Semiconductor) device on a 700V BCD technical platform. The present invention also relates to a manufacturing method for the isolation NLDMOS device.

BACKGROUND

The doping concentration of a DNW (deep N well) and an NW (N well) of a 40V isolation NLDMOS on a BCD700V, being shared with other devices, is unalterable. A DNW of an isolation NLDMOS functions to separate the body region from the substrate, thereby raising the doping concentration of the drift region and lowering the off-state breakdown voltage (off-By) of the device. As shown on FIG. 1, an NLDMOS structure of the prior art raises the off-state breakdown voltage by increasing the distance between the N well and the P well. Actual tape-out data shows that the on-state breakdown voltage of such a device is relatively low, the reason of which is that the doping concentration in the drift region near the channel side is reduced after the distance between the N well and the P well is increased and thereby cause a drop in the on breakdown voltage (on-BV).

SUMMARY

The technical problem the present invention aims to solve is to provide an isolation NLDMOS device which increases the on-state breakdown voltage of the device while guaranteeing the increase of the off-state breakdown voltage. The present invention also discloses a manufacturing method for the isolation NLDMOS device.

To solve the above-mentioned technical problem, the isolation NLDMOS device of the present invention comprises:

an N well and a P well adjacent to each other on the upper part of a P type substrate, wherein the P well is situated inside a deep N well, one side of the deep N well being underneath the arc side of the N well adjoining the P well; on the upper part of the P well are sequentially arranged a first P type heavily doped region, a first field oxide, and a second P type heavily doped region; on the upper part of the N well are arranged a second field oxide and an N type heavily doped region; a gate oxide is between the second P type heavily doped region and the second field oxide on the upper part of the P well and the N well respectively; a gate polysilicon sits above the gate oxide and part of the second field oxide; A connecting wire is led out via a contact hole respectively from the first P type heavily doped region, a second P type heavily doped region and the a type heavily doped region.

Wherein, a doping concentration of the first P type heavily doped region and of the second P type heavily doped region is between $1^{15}$ cm$^{-2}$ and $3^{15}$ cm$^{-2}$; a doping concentration of the N type heavily doped region is between $1^{15}$ cm$^{-2}$ and $3^{15}$ cm$^{-2}$; a doping concentration of the P well is between $1^{12}$ cm$^{-2}$ and $2^{13}$ cm$^{-2}$; a doping concentration of the deep N well is between $1^{12}$ cm$^{-2}$ and $2^{13}$ cm$^{-2}$; and a doping concentration of the N well is between $5^{12}$ cm$^{-2}$ and $3^{13}$ cm$^{-2}$.

The manufacturing method for the isolation NLDMOS device of the present invention comprises the following steps:

1) forming a deep N well on a P type substrate via implanting N ions;
2) forming a first field oxide on the deep N well via etching, and forming a second field oxide on the P type substrate via etching;
3) forming a P well via implanting P ions inside the deep N well, and forming an N well on the P type substrate via implanting N ions, wherein the P well and the N well are adjacent to each other, and one side of the deep N well being underneath an arc side of the N well adjoining the P well;
4) growing a gate oxide via thermal oxidation;
5) depositing a polysilicon, and forming a gate polysilicon therefrom via etching;
6) forming a first P type heavily doped region and a second P type heavily doped region via implanting heavily doped P ions on both sides of the first field oxide;
7) forming an N type heavily doped region by implanting heavily doped N ions into the N well on the side of the second field oxide farthest from the first field oxide;
8) leading forth a connecting wire from the first P type heavily doped region, the second P type heavily doped region and the N type heavily doped region via a respective contact hole.

Wherein, a doping concentration for manufacturing the first P type heavily doped region and the second P type heavily doped region is between $1^{15}$ cm$^{-2}$ and $3^{15}$ cm$^{-2}$; a doping concentration for manufacturing the N type heavily doped region is between $1^{15}$ cm$^{-2}$ and $3^{15}$ cm$^{-2}$; a doping concentration for manufacturing the P well is between $1^{12}$ cm$^{-2}$ and $2^{13}$ cm$^{-2}$; a doping concentration for manufacturing the deep N well is between $1^{12}$ cm$^{-2}$ and $2^{13}$ cm$^{-2}$; and a doping concentration for manufacturing the N well is between $5^{12}$ cm$^{-2}$ and $3^{13}$ cm$^{-2}$.

In the present invention, the deep N well are only implanted in the region underneath the P well (PW), and joins with the drift region (N well) by lateral diffusion, and thus realizes isolation of the P well (PW). The N well (NW) is shifted towards the channel side, while the drift region at the mean time is doped by N well with sufficient concentration, which ensures increase of both the on-state breakdown voltage (on-BV) and the off-state breakdown voltage (off-BV).

BRIEF DESCRIPTION OF THE DRAWINGS

In combination with drawings and embodiments provided hereunder, the present invention will be further expounded.

DETAILED DESCRIPTION

Figure 1:
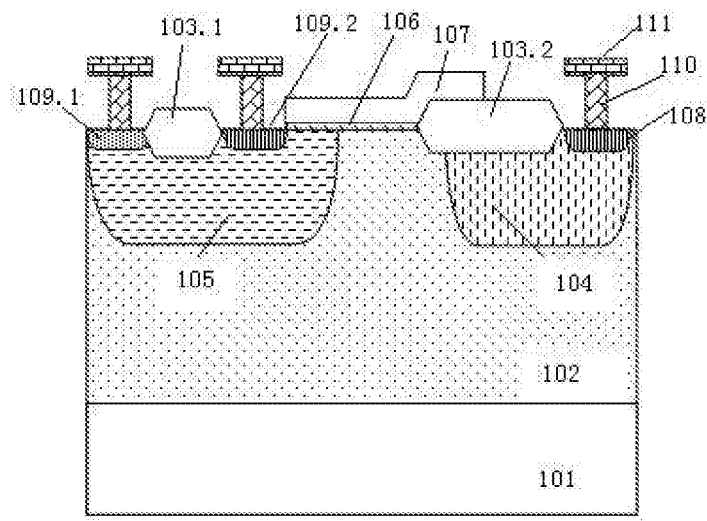
FIG. 1 is a schematic diagram of the isolation NLDMOS device of the prior art.
Figure 2:
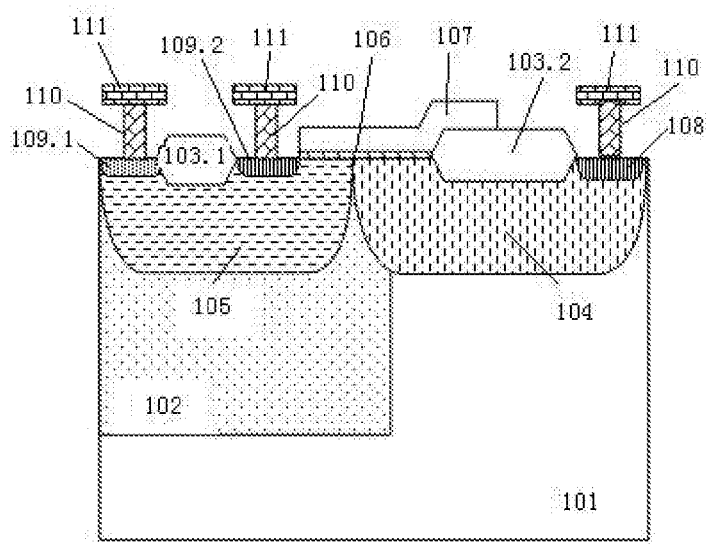
FIG. 2 is a schematic diagram of the isolation NLDMOS device of the present invention.

As is shown on FIG. 2, the isolation NLDMOS device of the present invention comprises:

an N well 104 and a P well 105 adjacent to each other on the upper part of a P type substrate 101, wherein the P well 105 is situated inside a deep N well 102, one side of the deep N well 102 being underneath the arc side of the N well 104 adjoining the P well 105; on the upper part of the P well 105 are sequentially arranged a first P type heavily doped region 109.1, a first field oxide 103.1, and a second P type heavily doped region 109.2; on the upper part of the N well 104 are arranged a second field oxide 103.2 and an N type heavily doped region 108; a gate oxide 106 is between the second P type heavily doped region 109.2 and the second field oxide 103.2 on the upper part of the P well 105 and the N well 104 respectively; a gate polysilicon 107 sits above the gate oxide 106 and part of the second field oxide 103.2; A connecting wire 111 is led out via contact hole 110 respectively from the first P type heavily doped region 109.1, the second P type heavily doped region 109.2 and the N type heavily doped region 108. Wherein, a doping concentration of the first P type heavily doped region and of the second P type heavily doped region is between $1^{15}$ cm$^{-2}$ and $3^{15}$ cm$^{-2}$; a doping concentration of the N type heavily doped region is between $1^{15}$ cm$^{-2}$ and $3^{15}$ cm$^{-2}$; a doping concentration of the P well is between $1^{12}$ cm$^{-2}$ and $2^{13}$ cm$^{-2}$; a doping concentration of the deep N well is between $1^{12}$ cm$^{-2}$ and $2^{13}$ cm$^{-2}$; and a doping concentration of the N well is between $5^{12}$ cm$^{-2}$ and $3^{13}$ cm$^{-2}$.

Figure 3:
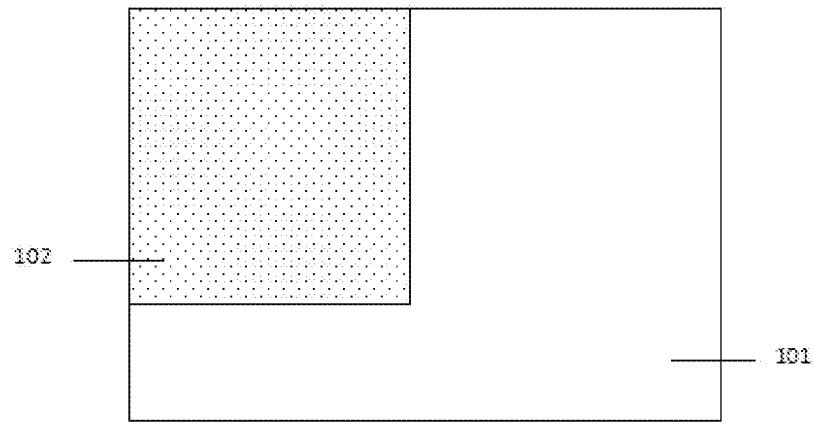
FIG. 3 is the first schematic diagram of the manufacturing method for the isolation NLDMOS device of the present invention.
Figure 4:
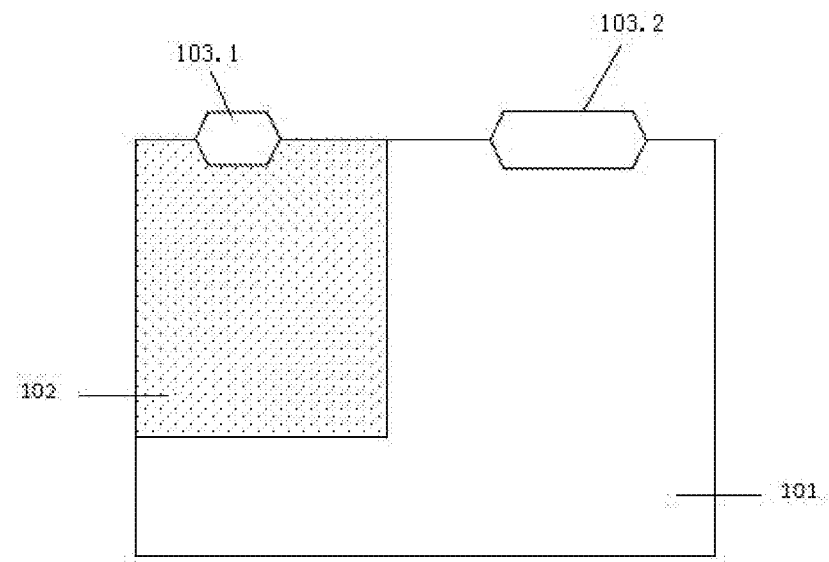
FIG. 4 is the second schematic diagram of the manufacturing method for the isolation NLDMOS device of the present invention.
Figure 5:
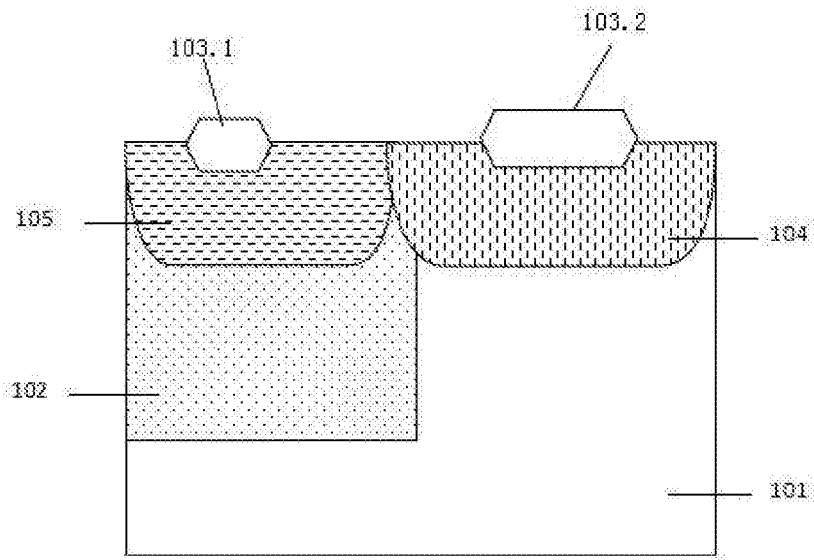
FIG. 5 is the third schematic diagram of the manufacturing method for the isolation NLDMOS device of the present invention.
Figure 6:
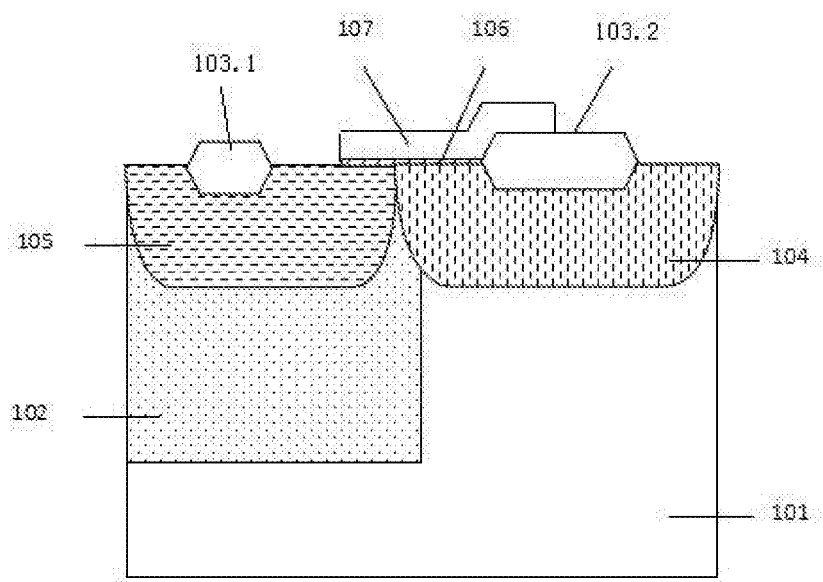
FIG. 6 is the fourth schematic diagram of the manufacturing method for the isolation NLDMOS device of the present invention.
Figure 7:
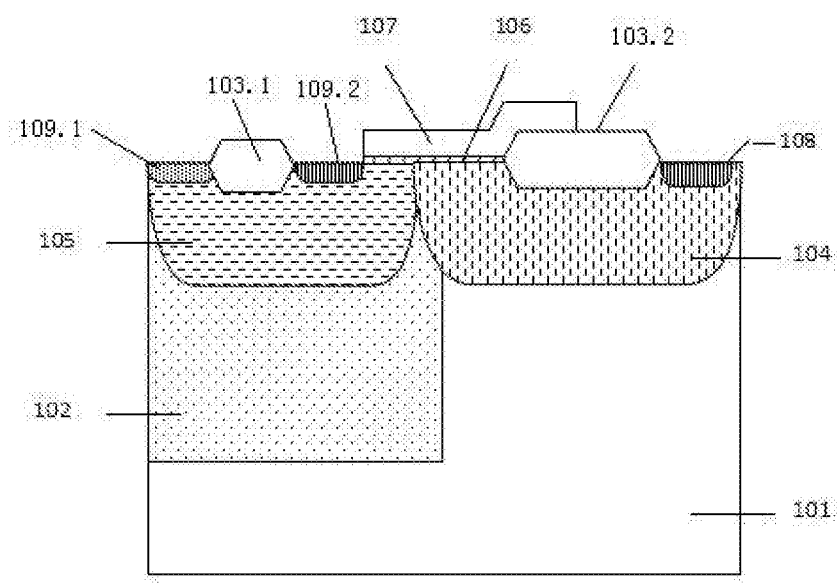
FIG. 7 is the fifth schematic diagram of the manufacturing method for the isolation NLDMOS device of the present invention.

The manufacturing method for the isolation NLDMOS device of the present invention comprises the following steps:

as is shown on FIG. 3,
1) forming a deep N well 102 on a P type substrate 101 via implanting N ions, wherein a doping concentration of the deep N well is between $1^{12}$ cm$^{-2}$ and $2^{13}$ cm$^{-2}$;

as shown in FIG. 4,
2) forming a first field oxide 103.1 on the deep N well 102 via etching, and forming a second field oxide 103.1 on the P type substrate 101 via etching;

as shown in FIG. 5
3) forming a P well 105 via implanting P ions inside the deep N well 102, and forming an N well 104 on the P type substrate 101 via implanting N ions, wherein the P well 105 and the N well 104 are adjacent to each other, and one side of the deep N well 102 being underneath an arc side of the N well 104 adjoining the P well 105, a doping concentration of the P well is between $1^{12}$ cm$^{-2}$ and $2^{13}$ cm$^{-2}$, and a doping concentration of the N well is between $5^{12}$ cm$^{-2}$ and $3^{13}$ cm$^{-2}$;

as shown in FIG. 6
4) growing a gate oxide 106 via thermal oxidation;
5) depositing a polysilicon, and forming a gate polysilicon 107 therefrom via etching;

as shown in FIG. 7,
6) forming a first P type heavily doped region 109.1 and a second P type heavily doped region 109.2 via implanting heavily doped P ions on both sides of the first field oxide 103.1, wherein a doping concentration for manufacturing the first P type heavily doped region and the second P type heavily doped region is between $1^{15}$ cm$^{-2}$ and $3^{15}$ cm$^{-2}$;

7) forming an N type heavily doped region 108 by implanting heavily doped N ions into the N well 104 on the side of the second field oxide 103.2 farthest from the first field oxide 103.1, a doping concentration of the N type heavily doped region is between $1^{15}$ cm$^{-2}$ and $3^{15}$ cm$^{-2}$;

8) leading out a connecting wire 111 via respective contact hole 110 respectively from the first P type heavily doped region 109.1, the second P type heavily doped region 109.2 and the N type heavily doped region 108.

The present invention has thus been enunciated in details with the embodiments, but is not meant to be limited thereby. The present invention is subject to variations and modifications by a person of the art without departing from the principles thereof, which shall fall within the scope of the present invention.

DESCRIPTION OF THE REFERENCE SIGNS FOR THE DRAWINGS

101: P type substrate
102: deep N well
103.1: first field oxide
103.2: second field oxide
104: N well
105: P well
106: gate oxide
107: gate polysilicon
108: N type heavily doped region
109.1: first P type heavily doped region
109.2: second P type heavily doped region
110: contact hole
111: connecting wire

What is claimed is:

1. An isolation NLDMOS device, comprising:
an N well and a P well adjacent to each other on an upper part of a P type substrate, wherein the P well is situated inside a deep N well, one side of the deep N well being underneath an arc side of the N well adjoining the P well; on an upper part of the P well is sequentially arranged a first P type heavily doped region, a first field oxide, and a second P type heavily doped region; on an upper part of the N well are arranged a second field oxide and an N type heavily doped region; a gate oxide is between the second P type heavily doped region and the second field oxide on the upper parts of the P well and the N well respectively; a gate polysilicon sits above the gate oxide and a part of the second field oxide; and a connecting wire is led out via a contact hole respectively from the first P type heavily doped region, the second P type heavily doped region and the N type heavily doped region.

2. The isolation NLDMOS device of claim 1, wherein a doping concentration of the N well is between $5^{12}$ cm$^{-2}$ and $3^{13}$ cm$^{-2}$.

3. The isolation NLDMOS device of claim 1, wherein a doping concentration of the first P type heavily doped region and of the second P type heavily doped region is between $1^{15}$ cm$^{-2}$ and $3^{15}$ cm$^{-2}$.

4. The isolation NLDMOS device of claim 1, wherein a doping concentration of the N type heavily doped region is between $1^{15}$ cm$^{-2}$ and $3^{15}$ cm$^{-2}$.

5. The isolation NLDMOS device of claim 1, wherein a doping concentration of the P well is between $1^{12}$ cm$^{-2}$ and $2^{13}$ cm$^{-2}$.

6. The isolation NLDMOS device of claim 1, wherein a doping concentration of the deep N well is between $1^{12}$ cm$^{-2}$ and $2^{13}$ cm$^{-2}$.

7. A manufacturing method for the isolation NLDMOS device, the method comprising:
   1) forming a deep N well on a P type substrate via implanting N ions;
   2) forming a first field oxide on the deep N well via etching, and forming a second field oxide on the P type substrate via etching;
   3) forming a P well via implanting P ions inside the deep N well, and forming an N well on the P type substrate via implanting N ions, wherein the P well and the N well are adjacent to each other, and one side of the deep N well being underneath an arc side of the N well adjoining the P well;
   4) growing a gate oxide via thermal oxidation;
   5) depositing a polysilicon, and forming a gate polysilicon therefrom via etching;
   6) forming a first P type heavily doped region and a second P type heavily doped region via implanting heavily doped P ions on both sides of the first field oxide;
   7) forming an N type heavily doped region by implanting heavily doped N ions into the N well on a side of the second field oxide farthest from the first field oxide; and
   8) leading forth a connecting wire from the first P type heavily doped region, the second P type heavily doped region and the N type heavily doped region via a respective contact hole.

8. The manufacturing method for the isolation NLDMOS device of claim 7, wherein a doping concentration for manufacturing the first P type heavily doped region and the second P type heavily doped region is between $1^{15}$ cm$^{-2}$ and $3^{15}$ cm$^{-2}$.

9. The manufacturing method for the isolation NLDMOS device of claim 7, wherein a doping concentration for manufacturing the N type heavily doped region is between $1^{15}$ cm$^{-2}$ and $3^{15}$ cm$^{-2}$.

10. The manufacturing method for the isolation NLDMOS device of claim 7, wherein a doping concentration for manufacturing the P well is between $1^{12}$ cm$^{-2}$ and $2^{13}$ cm$^{-2}$.

11. The manufacturing method for the isolation NLDMOS device of claim 7, wherein a doping concentration for manufacturing the deep N well is between $1^{12}$ cm$^{-2}$ and $2^{13}$ cm$^{-2}$.

12. The manufacturing method for the isolation NLDMOS device of claim 7, wherein a doping concentration for manufacturing the N well is between $5^{12}$ cm$^{-2}$ and $3^{13}$ cm$^{-2}$.

* * * * *